(12) United States Patent
Liddiard

(10) Patent No.: US 6,927,392 B2
(45) Date of Patent: Aug. 9, 2005

(54) ACTIVE OR SELF-BIASING MICRO-BOLOMETER INFRARED DETECTOR

(76) Inventor: Kevin Liddiard, 18 Ferrier Avenue, Fairview Park, South Australia (AU), 5126

( * ) Notice: Subject to any disclaimer, the term of this patent is extended or adjusted under 35 U.S.C. 154(b) by 184 days.

(21) Appl. No.: 10/333,934
(22) PCT Filed: Jul. 24, 2001
(86) PCT No.: PCT/AU01/00896
§ 371 (c)(1), (2), (4) Date: Jan. 24, 2003
(87) PCT Pub. No.: WO02/08707
PCT Pub. Date: Jan. 31, 2002

(65) Prior Publication Data
US 2003/0168599 A1 Sep. 11, 2003

(30) Foreign Application Priority Data
Jul. 25, 2000 (AU) .............................................. PQ8976

(51) Int. Cl.⁷ ................................................. G01J 5/00
(52) U.S. Cl. .................................. 250/338.1; 250/338.4
(58) Field of Search ............................ 250/338.1, 338.4

(56) References Cited

U.S. PATENT DOCUMENTS

| | | | |
|---|---|---|---|
| 4,574,263 A | | 3/1986 | Liddiard |
| 4,752,694 A | * | 6/1988 | Hegel et al. ............. 250/208.1 |
| 5,300,915 A | | 4/1994 | Higashi et al. |
| 5,369,280 A | | 11/1994 | Liddiard |
| 6,316,770 B1 | * | 11/2001 | Ouvrier-Buffet et al. 250/338.1 |
| 6,392,232 B1 | * | 5/2002 | Gooch et al. ............... 250/332 |

FOREIGN PATENT DOCUMENTS

| | | |
|---|---|---|
| EP | 0 139 408 B1 | 10/1988 |
| EP | 0 553 406 B1 | 4/1997 |

\* cited by examiner

*Primary Examiner*—Constantine Hannaher
(74) *Attorney, Agent, or Firm*—Sand & Sebolt

(57) ABSTRACT

The detector includes a thin-film resistive component (3), at least two first electrical contacts (6, 7) electrically connected to the resistive component (3) that provide for biasing and signal readout, at least one second electrical contact (1) electrically connected to the resistive component (3) that provides bias control, an integral infra-red absorption means (4, 5) and thermal isolation means (10, 11). The detector may further include a readout integrated microcircuit (RIOC).

23 Claims, 2 Drawing Sheets

ACTIVE OR SELF-BIASING MICRO-BOLOMETER INFRARED DETECTOR

BACKGROUND OF THE INVENTION

The present invention relates to a resistance microbolometer thermal infrared detector. Unlike a conventional resistance bolometer that is an electronically passive device, the present invention is for a detector that can be operated in various electronically active modes, hence the term active bolometer.

The concept of a thin film resistance bolometer has been known for many years, and a description can be found in various publications. See, for example, U.S. Pat. Nos. 4,574,263, 5,369,280, and 5,300,915, for a description of microbolometer operation and recent technologies.

Conventional resistance bolometers are essentially passive devices, in that they function as a simple resistor component in an electronic circuit. In operation as an infrared detector the electrical resistance is caused to change by an incremental amount following radiation exposure as a consequence of the temperature coefficient of resistance of the detector material, and this resistance change is detected as a change in electrical current flowing through the detector. The operation and performance of the detector is determined by the external applied bias, signal conditioning, and signal processing circuits.

In the case of a focal plane array of such detectors, small changes in material and dimensional parameters results in 'fixed pattern' noise, which must be corrected before the array can be usefully employed. The functionality and detective performance is limited by parameters such as resistivity and temperature coefficient of resistance, which are properties of the specific heat sensitive material employed in the detector.

It is an object of the present invention to provide for a bolometer that overcomes at least some of these problems or provides the public with a useful alternative.

SUMMARY OF THE INVENTION

Therefore in one form of the invention there is proposed an infrared radiation detector including:
  a thin-film resistive component;
  at least two first electrical contacts electrically connected to the resistive component so as to provide for biasing and signal readout;
  at least one second electrical contact electrically connected to the resistive component so as to provide bias control;
  an integral infrared absorption means; and
  a thermal isolation means.

Advantageously at least one second electrical contact is adapted to adjust the activation energy for electrical conduction in order to enhance the temperature coefficient of resistance of said resistive component.

Preferably the detector functions in a self-amplification mode for the purpose of signal conditioning.

Preferably the detector is located on a plane above or coplanar with a silicon wafer substrate.

Preferably the detector further includes a readout integrated microcircuit (ROIC).

Preferably the thin-film resistive component is formed in crystalline or amorphous silicon.

Preferably the thin-film resistive component is formed in alloys of silicon with material selected from the group consisting of hydrogen, nitrogen, germanium, boron, phosphorous, carbon, antimony, tin.

Preferably the resistive component includes a dopant said dopant adjusting the electrical resistance of said resistive component.

Preferably the dopant is formed from phosphorus or arsenic.

Preferably the resistive component is a single film.

Preferably the resistive component is a composite film constructed of two or more layers each layer having different electrical conductivity. A composite layer is typically constructed of two or more layers having different conductivity. The conductivity may be determined by varying the dopant or alloy concentration within the layers Preferably the conductivity of said layers is controlled by varying the amount of dopant or alloy concentration within the layers.

Preferably the integral infrared absorption means includes a back reflector, said resistive component and a top metal layer arranged to form an integral optical interference filter.

Preferably the thermal isolation means includes at least two legs raising said detector above the ground plane.

Preferably the said legs are of a generally small cross-sectional area.

Preferably the bias control modulates or adjusts the level of bias current operating in the detector.

Preferably the bias control switches the bias current in accordance with the signal readout requirements.

Preferably the detector element is adaptable for electronic amplification of the detected signal.

In a further form of the invention there is proposed a two-dimensional array of infrared detectors each detector including;
  a thin-film resistive component;
  at least two first electrical contacts electrically connected to the resistive component so as to provide for biasing and signal readout;
  at least one second electrical contact electrically connected to the resistive component so as to provide bias control;
  an integral infrared absorption means; and
  a thermal isolation means.

Preferably the bias control serves the function of removing fixed pattern noise from said two-dimensional array.

In preference an electronic circuit, which operates the bias control, is an external circuit or formed on a ROIC.

Preferably each detector further including a memory component that stores bias values optionally as an external component or formed on the ROIC.

In preference said detectors are adapted to function in a conventional passive mode without the bias control.

In preference the thermal isolation includes two or more legs of generally small cross-sectional area, which extend to pillars elevated above the substrate so that thermal isolation is achieved by plasma etching of a polyimide sacrificial layer.

In a yet further form of the invention there is proposed a method of producing an infrared radiation detector substantially as herein described.

Thus the present invention provides for an active bolometer that generally includes at least one control electrode in addition to the two bias electrodes that pass bias current. The device generally functions in a similar manner to a thin film transistor, in that the two bias electrodes function as 'source' and 'drain', and the control electrode as a 'gate', thereby enabling control of bias current and device performance.

The ability to operate a bolometer in this manner offers considerable advantages in terms of enhanced functionality, versatility and detective performance.

An improved bolometer is therefore provided by virtue of one or more of the following;

a. controlled switching or modulation of the bias voltage;
b. in conjunction with supporting electronics and on-chip temperature sensors, automatic correction to the bias current to eliminate fixed pattern noise;
c. in conjunction with supporting electronics and on-chip temperature sensors, provision of automatic corrections to the bias current to compensate for bias temperature variations;
d. the ability to tune the detector to adjust the activation energy for electrical conduction and hence the temperature coefficient of resistance; and
e. capability of self-amplification of the detected IR signals.

Other objects and advantages will become apparent when taken into consideration with the following drawings and specifications.

BRIEF DESCRIPTION OF THE DRAWINGS

The accompanying drawings, which are incorporated in and constitute a part of this specification, illustrate several implementations of the invention and, together with the description, serve to explain the advantages and principles of the invention. In the drawings.

DESCRIPTION OF THE PREFERRED EMBODIMENTS

The following detailed description of the invention refers to the accompanying drawings. Although the description includes exemplary embodiments, other embodiments are possible, and changes may be made to the embodiments described without departing form the spirit and scope of the invention. Instead, the scope of the invention is defined by summary of the invention and appended claims, if any. Wherever possible, the same reference numbers will be used throughout the drawings and the following description to refer to the same and like parts.

Figure 1:
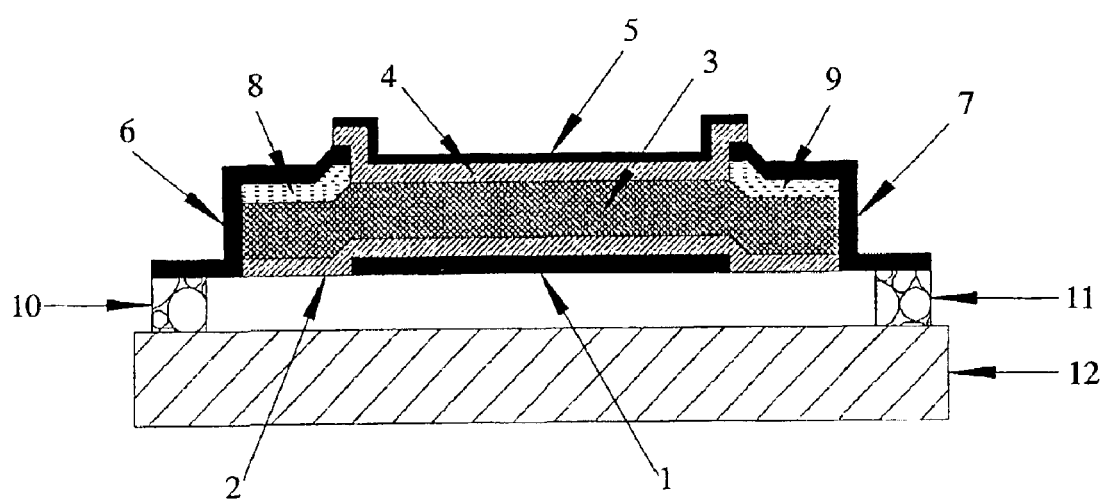
FIG. 1 is a cross-sectional schematic of an active bolometer according to a first embodiment of the present invention and illustrating the various layers forming the detector.

FIG. 1 illustrates a bolometer including a thin film metal control electrode 1, which has the dual function of acting as an electrical contact and optical reflector, bottom insulator layer 2, semiconductor layer 3, top insulator 4, and top metal film 5. Electrical contact to the semiconductor layer 3 is made for the purpose of bias and signal readout by contacts 6 and 7. Heavily doped semiconductor layers 8 and 9 may advantageously be placed between the semiconductor layer 3 and contacts 6 and 7 to obtain low-contact resistance. The detector structure may be generally supported on pillars 10 and 11 above a single crystal silicon wafer substrate 12. The pillars may be advantageously solid metal structures prepared by such processes as copper or aluminium damascene technology, or formed by thin film processes such as image reversal lithography and lift-off.

Generally, it is preferred that the silicon wafer will have formed in its surface a microelectronic circuit for signal conditioning and readout.

Figure 2:
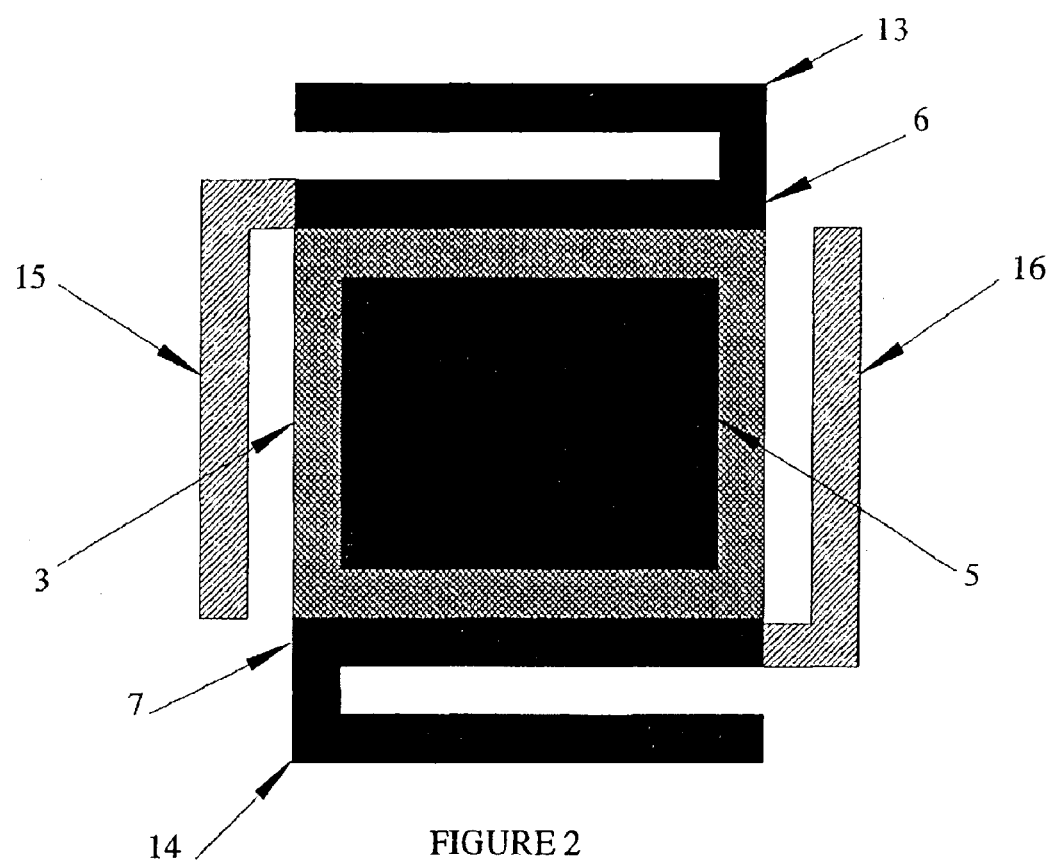
FIG. 2 is a plan view illustrating the thermal isolation of said detector.

FIG. 2 illustrates one possible arrangement for thermal isolation. In this simplified plan view, the metal film 5 is shown on top of the semiconductor layer 3. The bias contact electrodes 6 and 7 make electrical contact to each end and on top of the semiconductor layer and extend to legs 13 and 14. The legs have the dual purpose of electrical interconnection and thermal isolation, and are supported at the ends by pillars 10 and 11. The control electrode 1 extends to legs 15 and 16, which function in similar manner as legs 13 and 14. It will be understood that legs 15 and 16 extend from the bottom of the semiconductor layer. Because of the inherent strength and mechanical stability of the four-leg structure, each leg can be formed with small cross-sectional area to attain a low thermal conductance. However, other constructions may equally well be applicable. For example, in a further configuration four pillars of low thermal conductance may be positioned at the periphery of the detector structure.

The detector will generally be formed on top of a 'sacrificial layer' such as a polyimide layer (not shown), which is coated on the silicon wafer 12. Vias are opened in the polyimide layer by conventional lithography and reactive ion etching (RIE), and pillars 10 and 11 extend through the vias to the underlying silicon wafer.

The following description provides information as to one possible order of manufacture of the detector components.

Metal film 1 is first deposited using conventional lithography and patterning by either lift-off or sputter etching. The preferred metals are nickel-chrome alloy or titanium. The thickness of this layer must be sufficient to act as an infrared reflector in the waveband 8 to 13 $\mu$m, and this requirement is met if the sheet resistance of the film exceeds 10 ohms per square. Dielectric layer 2 is in preference silicon nitride, but may be another suitable dielectric material such as silicon carbide, and is patterned using RIE. The semiconductor material forming layer 3 will be an amorphous silicon or silicon alloy, including one of:

a. phosphorous or boron gas-phase doped amorphous silicon hydrogen alloy, a-Si:H, prepared by plasma enhanced chemical vapour deposition (PECVD) or physical deposition (sputter or thermal evaporation);
b. alloys of silicon with germanium; and
c. an alloy of silicon with nitrogen, boron, phosphorous, carbon, antimony or tin, prepared by co-deposition of silicon and the alloying material by physical vapour deposition The ability to vary the electrical resistivity and activation energy of silicon by gas phase doping or alloying with germanium is well known. The use of silicon alloyed with nitrogen, boron, phosphorous, carbon, antimony or tin for resistance bolometers provides a novel alternative of which only nitrogen has been previously been known in the present application. Varying the alloying metal content significantly alters the electrical properties of the material to meet specific performance requirements. These alloys may or may not have hydrogen within the material. One objective of this material embodiment is to reduce the amount of hydrogen or eliminate it completely for the purpose of achieving low values of excess noise.

Microcrystalline silicon and polycrystalline silicon are cited as optional to amorphous silicon.

Following deposition and patterning of the silicon layer, layers 8 and 9 may be deposited and patterned. A low contact resistance is achieved by conventional methods such as gas-phase doping or ion implantation, or by using low resistivity alloys formed of the materials cited above for layer 3. Layer 4 is in preference silicon nitride, but other suitable dielectric such as silicon carbide may be employed. Metal layer 5 is in preference nickel-chrome alloy or titanium, but other metals including platinum may be suitable alternatives. This layer is semi-transmitting to infrared radiation in the waveband 8 to 13 μm, and has a nominal sheet resistance of 377 ohm per square.

The detector 'stack' comprising layers 1,2,3,4 and 5 comprises an integral optical interference filter (also known as an optical cavity) for absorption of infrared radiation in the desired waveband. This is a desirable, although not an essential feature of the invention. It may be noted that the top metal 5 is optional, in particular if layer 4 has the appropriate absorption index to meet the requirement for infrared absorption.

The final operation is to remove the sacrificial layer by plasma etching, causing the detector to be thermally isolated from the underlying substrate.

Figure 3:
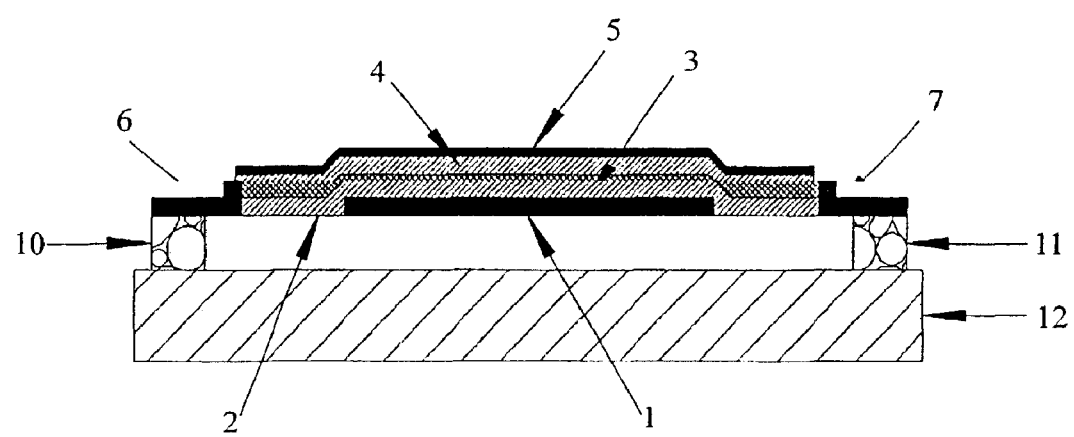
FIG. 3 is a cross-sectional view of an alternate embodiment of the present invention.

In an alternative arrangement, shown in FIG. 3, layers 2, 3, 4 and 5 may be deposited in sequence and patterned using the same photo mask, the metal film 5 being sputter etched and the other films patterned using RIE.

It is to be understood that the technology described herein can be applied to either single detector elements or two-dimensional arrays of detectors. The latter may be in the form of sparse or close-packed arrays. A sparse array enables some versatility in the means for thermal isolation. For example, the folded legs shown in FIG. 3 must be used for close-packed arrays, but for sparse arrays the legs can extend outwards to any convenient location. A large number of detectors or detector arrays can be fabricated by step-and-repeat lithographic methods, and then diced into separate chips for mounting, bonding and packaging.

In other embodiments more than one control electrode may be employed to enable dual control functions in the same detector element. It will be understood by those skilled in the art that a detector prepared by the methods described will also function in passive mode, so that this specification is intended to include new methods for fabrication of micro-bolometers in general.

Advantageously, the detector or detector array will be integrated on the same silicon wafer as the associated ROIC, however, one or more of the signal conditioning and readout circuits may be located off-chip. Furthermore signal-processing circuits may also be located on or off the detector chip.

The detector may be operated with either a steady state (DC) or modulated bias current applied to the bias electrodes. A voltage applied to the control electrodes will alter the conductivity of the semiconductor, by virtue of the well-known theory of thin film field effect transistors, thereby changing the bias current and signal voltage. This characteristic is particularly advantageous for an array of detectors where, with the aid of associated signal processing, the bias may be adjusted on a detector-to-detector basis to remove fixed pattern noise arising from small variations in the detective performance of individual detectors at a given operational temperature. Furthermore, it is possible to adjust for larger signals that occur when the detector temperature changes, thus removing the requirement for temperature stabilization.

The ability to control bias current also suggests that applying a modulated control voltage could modulate the bias current. This alternative embodiment might be advantageous in that the signal would also be modulated and detectable by techniques such as phase sensitive detection.

In some applications it may be advantageous to change the activation energy for electrical conduction of the semiconductor layer. This may be useful to adjust for variations that occur in semiconductor preparation, where the properties are difficult to control, or where the applied control voltage shifts the properties into a region of higher activation energy, hence sensitivity.

Those skilled in the art will appreciate that the present invention provides for significant improvements over existing technology, including, but not limited to the following:

a. the ability to tune the electrical resistance of the detector to match optimum input impedance of the associated ROIC;

b. the activation energy may be tuned to give a desired temperature coefficient of resistance; thus when applied to a focal plane detector array the uniformity of response across the array can be enhanced;

c. by integrating the detector with an appropriately designed ROIC it will be possible to utilise the ability to control the resistance and activation energy in order to self-bias the circuit, taking the form of a feedback circuit to compensate for changes in resistance and activation energy due to ambient temperature drift; and d. ability of the detector to act as a switch.

Further advantages and improvements may very well be made to the present invention without deviating from its scope. Although the invention has been shown and described in what is conceived to be the most practical and preferred embodiment, it is recognized that departures may be made therefrom within the scope and spirit of the invention, which is not to be limited to the details disclosed herein but is to be accorded the full scope of the claims so as to embrace any and all equivalent devices and apparatus.

What is claimed is:

1. An infrared bolometer radiation detector which functions as a thin-film field-effect transistor comprising:

a thin-film semiconductor component;

at least two first electrical contacts connected to the semiconductor component to act as source and drain electrodes;

at least one second electrical contact to function as a gate electrode;

a first thin-film insulator layer between the gate electrode and semiconductor layer;

a second thin-film insulator layer deopsited on the semiconductor layer on the opposite surface to that of the first insulator layer;

a top metal film deposited onto the second insulator layer;

an integral absorption means; and a thermal isolation means.

2. An infrared radiation detector as in claim 1, wherein said at least one second electrical contact is adapted to adjust the activation energy for electrical conduction in order to enhance the temperature coefficient of resistance of said semiconductor component.

3. An infrared radiation detector as in claim 1, wherein said detector functions in a self-amplification mode for the purpose of signal conditioning.

4. An infrared radiation detector as in claim 1, wherein said detector is located on a plane above or coplanar with a silicon wafer substrate.

5. An infrared radiation detector as in claim 1, wherein said detector further includes a readout integrated microcircuit (ROIC).

6. An infrared radiation detector as in claim 1, wherein the thin-film semiconductor component is formed in crystalline or amorphous silicon.

7. An infrared radiation detector as in claim 1, wherein the thin-film semiconductor component is formed in alloys of silicon as distinct from dopants, with material selected from the group consisting of hydrogen, nitrogen, germanium, boron, phosphorous, carbon, antimony and tin.

8. An infrared radiation detector as in claim 1, wherein said semiconductor component includes a dopant, said dopant adjusting the electrical resistance of said semiconductor component.

9. An infrared radiation detector as in claim 8, wherein said dopant is formed from phosphorus or arsenic.

10. An infrared radiation detector as in claim 1, wherein said semiconductor component is a single film.

11. An infrared radiation detector as in claim 1, wherein said semiconductor component is a composite film constructed of two or more layers, each layer having different electrical conductivity and formed during the same deposition process.

12. An infrared radiation detector as in claim 11, wherein the conductivity of said layers is controlled by varying the amount of dopant or alloy concentration within the layers.

13. An infrared radiation detector as in claim 1, wherein said integral absorption means includes a back reflector formed by the gate electrode, said semiconductor component and the top metal film arranged to form an integral optical interference filter.

14. An infrared radiation detector as in claim 1, wherein the thermal isolation means includes at least two legs raising said detector above the ground plane.

15. An infrared radiation detector as in claim 14 wherein said legs are of a generally small cross-sectional area.

16. An infrared radiation detector as in claim 1, wherein a voltage applied to the gate electrode modulates or adjusts the level of bias current operating in the detector.

17. An infrared radiation detector as in claim 1, wherein a voltage applied to the gate electrode switches the bias current in accordance with the signal readout requirements.

18. An infrared radiation detector as in claim 1, wherein the detector is adaptable for electronic amplification of the detected signal.

19. A two-dimensional array of infrared detectors wherein each detector comprises:
   a thin-film semiconductor component;
   at least two first electrical contacts connected to the semiconductor component to act as source and drain electrodes;
   at least one second electrical contact to function as a gate electrode;
   a first thin-film insulator layer between the gate electrode and semiconductor layer;
   a second thin-film insulator layer deposited on the semiconductor layer on the opposite surface to that of the first insulator layer;
   a top metal film deposited onto the second insulator layer;
   an integral absorption means; and
   a thermal isolation means.

20. A two-dimensional array of infrared detectors as in claim 19 wherein a voltage applied to the gate electrode serves the function of removing fixed pattern noise from said two-dimensional array.

21. A two-dimensional array of infrared detectors as in claim 19 wherein an electronic circuit which controls the voltage applied to the gate electrode is an external circuit or is formed on a readout integrated microcircuit (ROIC).

22. A two-dimensional array of infrared detectors as in claim 19, wherein each detector further includes a memory component that stores bias values optionally as an external component or formed on the readout integrated microcircuit (ROIC).

23. A two-dimensional array of infrared detectors as in claim 19, wherein said detectors are adapted to function in a conventional passive mode without a voltage being applied to the gate electrode.

* * * * *

UNITED STATES PATENT AND TRADEMARK OFFICE
CERTIFICATE OF CORRECTION

PATENT NO. : 6,927,392 B2
DATED : August 9, 2005
INVENTOR(S) : Kevin Liddiard

It is certified that error appears in the above-identified patent and that said Letters Patent is hereby corrected as shown below:

Column 6,
Line 45, replace the word "deopsitied" with the word -- deposited --.

Signed and Sealed this

Fourth Day of October , 2005

JON W. DUDAS
*Director of the United States Patent and Trademark Office*